United States Patent [19]

Taguchi

[11] 4,199,750
[45] Apr. 22, 1980

[54] KEY INPUT CIRCUIT CAPABLE OF ROLL-OVER OPERATION

[75] Inventor: Tamio Taguchi, Kodaira, Japan

[73] Assignee: Hitachi, Ltd., Japan

[21] Appl. No.: 759,187

[22] Filed: Jan. 13, 1977

Related U.S. Application Data

[63] Continuation of Ser. No. 657,236, Feb. 11, 1976, abandoned.

[30] Foreign Application Priority Data

Nov. 10, 1975 [JP] Japan .................................. 50/134105

[51] Int. Cl.² .......................... G08C 25/00; G06F 3/02
[52] U.S. Cl. ............................. 340/365 E; 340/365 S
[58] Field of Search ............ 340/365 R, 365 E, 365 S; 328/37; 179/90 K; 178/17 C

[56] References Cited

U.S. PATENT DOCUMENTS

| | | | |
|---|---|---|---|
| 3,660,826 | 5/1972 | Lins ................................... | 340/365 E |
| 3,764,997 | 10/1973 | Hatano et al. ...................... | 340/365 S |
| 3,883,867 | 5/1975 | Hatano et al. ..................... | 340/365 R |
| 3,928,847 | 12/1975 | Spence .............................. | 340/365 E |
| 3,949,365 | 4/1976 | Kashio ............................. | 340/365 S |
| 3,950,743 | 4/1976 | Hatano et al. ..................... | 340/365 S |
| 3,969,592 | 7/1976 | Pipitone et al. .................. | 340/365 E |

*Primary Examiner*—John W. Caldwell, Sr.
*Assistant Examiner*—James J. Groody
*Attorney, Agent, or Firm*—Craig and Antonelli

[57] ABSTRACT

In a key input circuit, the key input signal is serialized and applied directly and through a circulating register working with a certain delay time to one gate for transmitting the direct key input signal and to another gate for transmitting the output of the register utilizing the other signal as an inhibitation signal. The output of the one gate is supplied to an output means which allows the passage at a predetermined time later and the output of the another gate is used to erase the corresponding contents of the register at a predetermined time later. This erasing is inhibited for a predetermined time period to allow a new key input signal.

17 Claims, 32 Drawing Figures

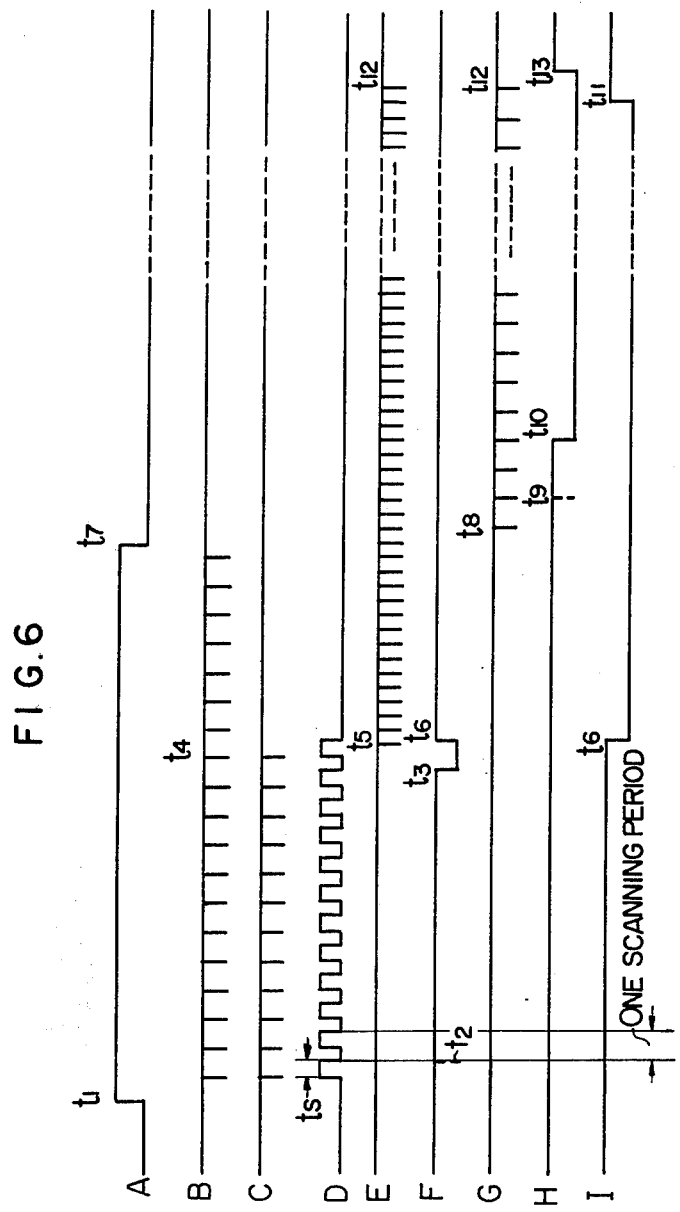

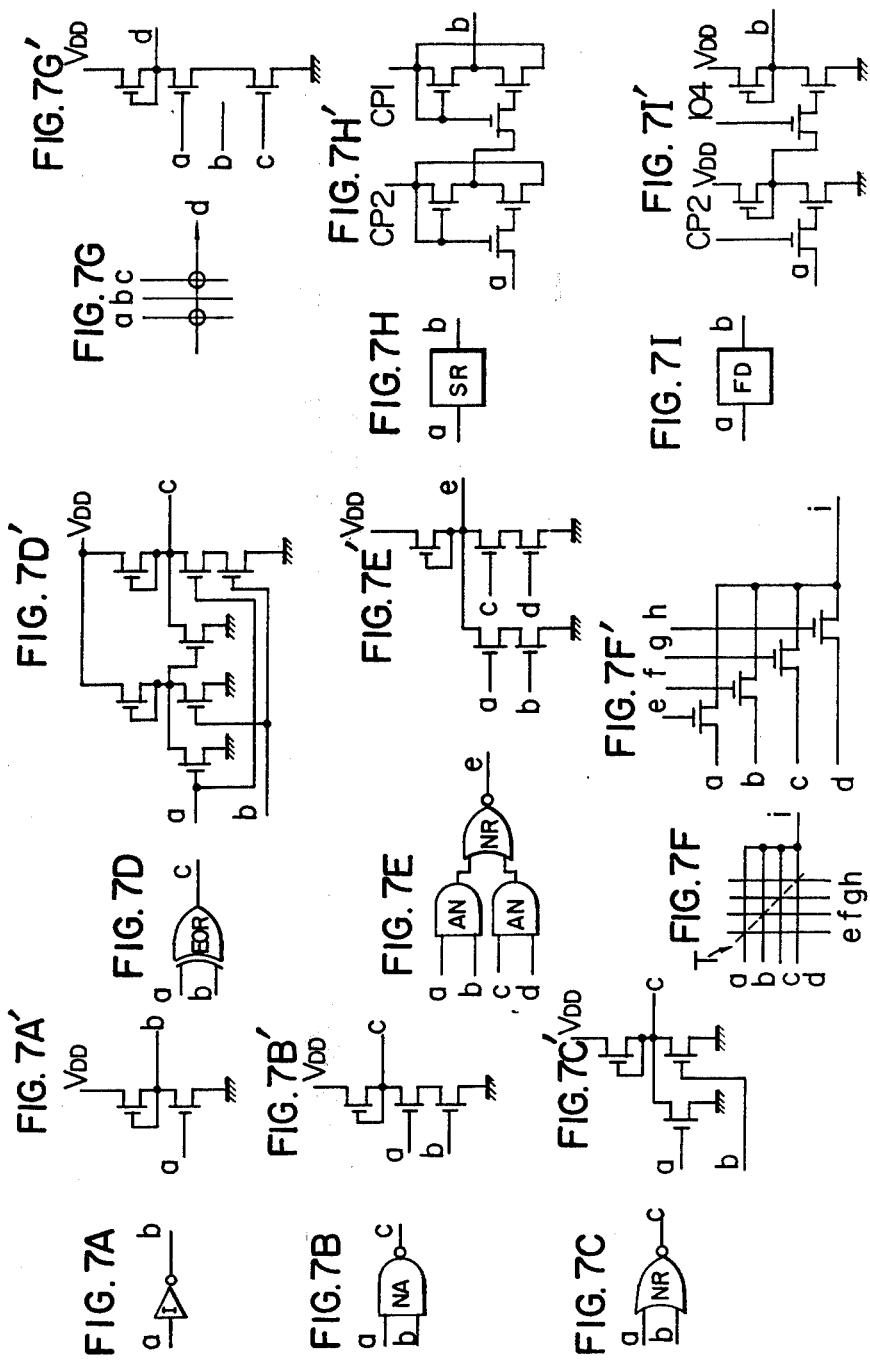

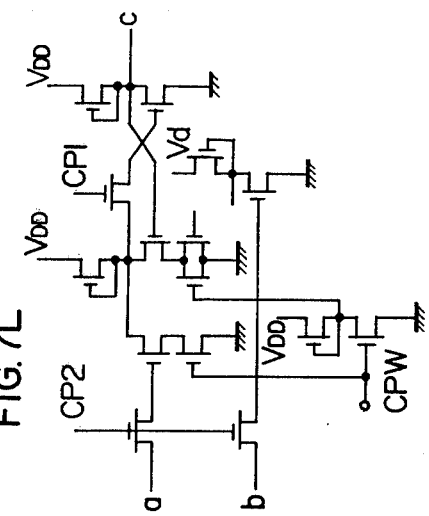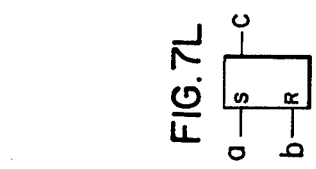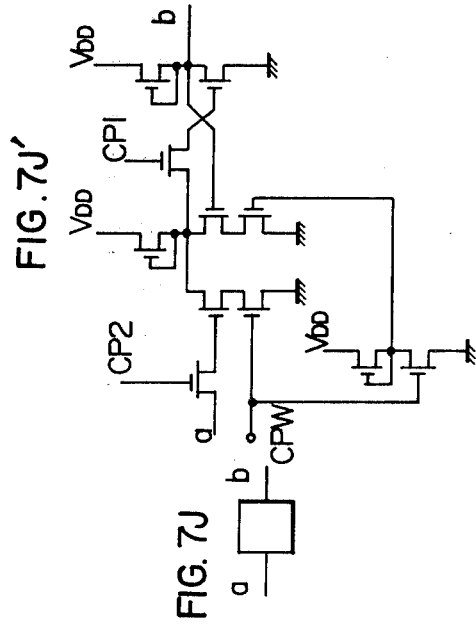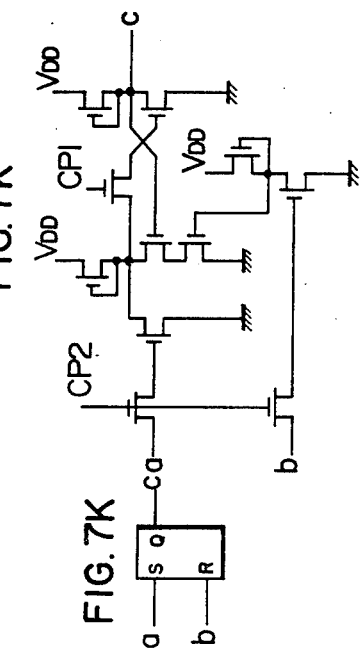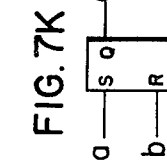
FIG.7L' FIG.7L FIG.7J' FIG.7J FIG.7K' FIG.7K

KEY INPUT CIRCUIT CAPABLE OF ROLL-OVER OPERATION

This is a continuation of application Ser. No. 657,236, filed Feb. 11, 1976, now abandoned.

This invention relates to a key input circuit, and more particularly to a key input circuit capable of roll-over.

In inputting information into an electronic desk-top calculator by key operation, it is desirable that a newly depressed key can give corresponding information regardless of the fact that the previously depressed key is still being depressed or has already been released, i.e., that the key input means is arranged to be capable of roll-over.

By arranging the key input means in this way, the restrictions for the movement of fingers of an key operator can be reduced compared with those of the case of using the key input means which can enable a new key input only when the previously depressed key has been released. Thus, by the use of roll-over key input means the key input operation can be simplified and the key input can be made at a higher speed since a next key can be depressed even when the previous keys have not been released.

For example, U.S. Pat. No. 3,792,466 specification describes a key input circuit capable of roll-over which has a key detection circuit provided with two input means, one receiving the key signal directly and the other receiving the key signal through a shift register having a delay time of one scanning period. The output of a circuit for scanning a key board matrix and generating a key signal (series key signal) at a specified time corresponding to the depressed key of the key board matrix is supplied to this key detection circuit. According to this U.S. Patent, the output of the shift register appears one scanning period after the appearance of the original key signal. The key detection circuit detects the key signal only when a key signal arrives but no output appears from the shift register. Namely, as long as a key is depressed, one input of the key detection circuit receives a corresponding key signal once in every scanning period and the other input also receives the similar signal with a delay of one scanning period. But detection is done only in the first scanning period after a key depression, since the one input of the key detection circuit receives a key signal but the other does not as no output is supplied from the shift register in this period. The key detection circuit supplies a corresponding output only in such first scanning period but not in the following scanning periods in which both inputs receive similar signals. Thus, according to this method, even when one key is being depressed if another key is newly depressed, the key detection circuit responds to this another key depression in the succeeding one scanning period. In other words, even when a plurality of keys are depressed in a overlapped fashion, the key depression circuit can discriminate the plurality of keys only if the commencement of the depression of respective keys differ from each other.

On the other hand, it is desirable that such a key input means capable of roll-over can be adapted to any type of keys.

For example, in the case of using a simple key of electric contact type, the signal transmission may be interrupted by chattering for the order of several milliseconds after the contacts are touched to each other. Further, even when the chattering of the contacts has ended and the electric contact state between the contacts becomes stable, the contact having moved mechanically may be temporarily brought into cut-off state due to reaction, i.e. bounce. In some kinds of keys, the bounce state may continue for the order of a few tens of milliseconds. Further in releasing a key, the contacts may not be immediately opened completely, but through intermittent open states by chattering.

Therefore, in the case of using such keys which may produce chattering or bounce, if the signal read-in period or read-in time of the circuit for receiving the signal from the keyboard and generating the key detection signal is short but is in a range that the read-in period or read-in time cannot be neglected against the time of said chattering or bounce, the key detection circuit may discriminate that a key is once opened and then depressed again and generate two or more detection signals, while the key is continuously depressed. Further, when a key is depressed succeedingly after another key, if the previously depressed key causes chattering the detection circuit may supply such false outputs such that the previously depressed key is depressed somewhat after the depression of the other key.

Thus, a key input circuit capable of roll-over and adaptive to keys which may produce chattering or bounce has been desired.

An object of this invention is to provide a key input circuit enabling precise and high speed key inputting.

Another object of this invention is to provide a key input circuit capable of discriminating the order of key operation and supplying the key input signal of the respective keys when a plurality of keys are operated, which operations of keys are overlapped in time.

A further object of this invention is to provide a key input circuit capable of normal key inputting even with keys the contact states of which are not stable immediately after the key operation.

Another object of this invention is to provide a key input circuit capable of using any kind of keys, simple contact type, magnet type, piezoelectric type or electromagnetic relay type.

Another object of this invention is to provide a key input circuit adapted for circuit integration.

Another object of this invention is to provide a key input circuit adapted for the use in an electronic desk-top calculator.

Further objects, features and advantages of the invention will become apparent in the following description made in conjunction with the accompanying drawings, in which:

FIGS. 5 and 6 show signal waveforms at various points of the circuit of FIG. 1;

FIGS. 7A to 7L are detailed circuit diagrams of the examples of the circuits of FIGS. 2 to 4.

Figure 1:
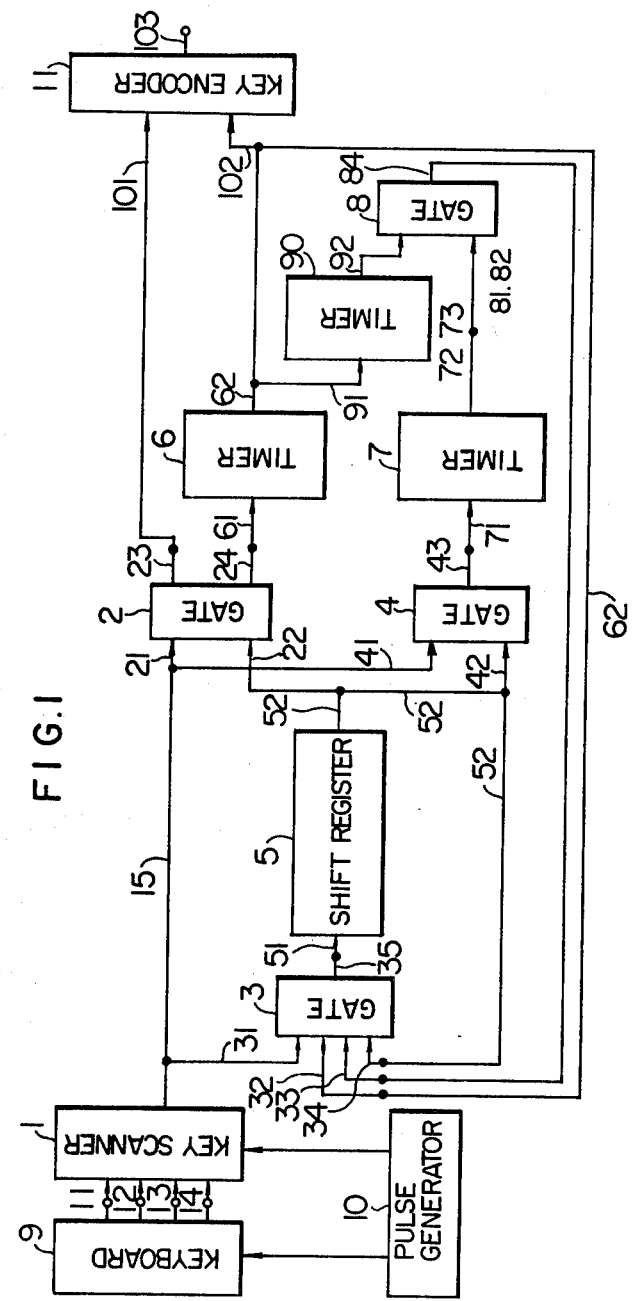
FIG. 1 is a block diagram of an embodiment of a key input circuit according to this invention.

Preceding the description of the accompanying drawings, the outline of this invention will be described.

According to this invention, key operation of a plurality of keys is transformed into a series signal. Namely, all the keys are scanned once in one scanning period and a series signal including bits corresponding to the respective keys is generated. When a key is operated, a signal level is generated at a corresponding bit site in the series signal and this signal at a particular bit site is treated as a key input signal. Thus, when a plurality of keys is superposedly operated, bit signals of the number equal to that of the operated keys are generated on a line of the key input signal once in one scanning period, i.e., in one unit period of the series signal.

For detecting such a key signal, a timer circuit, a gate circuit and a circulating shift register are used in addition to a key input detection circuit. When a key input signal is generated, it is supplied to the gate circuit directly and through the circulating register. The circulating register reads in an input signal when it receives a control signal from the timer circuit and supplies a similar key signal one scanning period later and a similar one in each succeeding period. The timer circuit gives a predetermined delay time with respect to the first key input signal. Then, the gate circuit generates an output signal when a key input signal arrives but no corresponding signal arrives from the circulating register. The detection circuit detects the output of the first gate signal under the control of the timer circuit, i.e., in one scanning period.

When a key is newly operated, the timer circuit is started by the first signal corresponding to the operated key. The timer circuit generates an output signal for a predetermined period preferably for a time equal to said one scanning period after a predetermined time has passed from its being started.

The circulating register is arranged to be capable of storing a number of bits at least equal to the number of bits of said series signal, receives the key input signal under the control of the output signal of said timer circuit, and outputs a signal which is at least the same as a key input signal inputted after one scanning period from the start of the input in synchronism with the key input signal inputted after one scanning period. Thereafter, the register continues to supply a similar signal at least once in one scanning period.

The gate circuit receives the key input signal and the output signal of the circulating register, and generates an output signal only when a key input signal exists and no corresponding signal is supplied from the circulating register.

Thus, the gate circuit outputs a signal corresponding to the key input signal once in one scanning period from the time when the key input signal is applied, then an output signal appears from the timer circuit, and until further the key input signal inputted to the circulating register appears at the output of this circulating register.

Although it is not meant in a restrictive sense, if the timer circuit is of the type which counts units of scanning period, the detection of a key input signal by the detection circuit can be performed by detecting the output of the first gate circuit under the control of the output signal of the timer circuit. Alternatively, if the timer circuit is of the type which counts the units of a bit, the detection of the key input signal can be performed by detecting the output itself of the timer circuit.

Thus, the time required from the generation of a key input signal until the detection of the key input signal can be varied arbitrarily by the time determined by the timer circuit. Hence the time required from the generation of a key input signal to the detection of the key input signal can be set to be longer than the time from the initiation of the key input signal until the disappearance of the effects of the chattering of the key on the key input signal.

When a key input signal corresponding to the key being operated has been inputted into the circulating register, the gate circuit does not output a signal corresponding to this key input signal. However, for another key input signal corresponding to a newly depressed key different from the above key, the gate circuit generates an output signal since no corresponding signal exists in the above register. Therefore, the key input signal corresponding to this newly operated key initiates the timer circuit and after a predetermined time is allowed to be inputted into the circulating register similar to the foregoing.

According to this invention, the contents of the circulating register are cleared when the key depression has released for enabling re-input of the same key input when the same key is required to be operated repeatedly.

In this case, it is desirable that the contents of the register are not cleared immediately after the end of a key depression state but after the lapse of a predetermined time. By providing such a certain time after the end of a key operation, it can be prevented that the circuit discriminates erroneously that a new key input signal has been provided, as will be described later.

Further, it is desirable that when a plurality of keys are operated and are overlapped in time, this clearing operation is not done after all the keys are released but every time when each one of the plurality of keys has been released. By so doing this, when a plurality of keys are operated and a key which is the same as the one operated or the previous occasion is desired to be depressed again, there is no need for providing a particular key depression stop time for clearing the circulating register. Thus, the key input operation can be made at a higher speed.

A second gate circuit and a second timer circuit are preferably adopted for this clearing operation of the circulating register.

The second gate circuit receives the key input signal and the output of the circulating register in the same way as in the case of said gate circuit, but provides an output signal which is different from that of said gate circuit. Namely, the second gate circuit provides an output when there is an output signal from the circulating register, and there is no key input signal at the time corresponding to the above output from the circulating register. In other words, the second gate circuit detects the end of a key operation.

The second timer circuit is started by the output signal of the second gate circuit and generates an output after a certain time determined by the characteristic of the timer circuit itself has elapsed. The output signal of the second timer circuit is used to clear the signal corresponding to that used for initiating this second timer circuit. For example, the second timer circuit provides an output for one bit time after an integer times of said scanning period has precisely elapsed from the activation of the circuit. In this example, the signal of one bit time prevents the signal circulating through the circulating loop of the circulating register for said one bit time so as to erase among the circulating signals only the signal corresponding to the one which initiated the operation of the second timer circuit.

A more preferable mode of the output signal of the second timer circuit is to make the time for appearance of the output signal the same as the time required for said one scan or more preferably to make the time the same as one scanning period.

In this case, the circulating loop of the circulating register is made to be opened for a period equal to one scanning period by the output signal of the second timer circuit. Further, under the control of the output of the second timer circuit those key input signals which coincide with the output signals of the circulating register are read-in again into the register.

Thus, even when the second timer circuit provides an output for one scanning period, it is prevented from clearing all of the contents of the circulating register.

Namely, when the circulating loop is opened in response to the release of one key but another key or keys are still being depressed, if a key input signal corresponding to said another key or keys are already read in the register, the signal or signals are read-in again within the period of the output of said second timer circuit. When the mode of output signal which is present for above second scanning period of the second timer circuit, the signal corresponding to the key newly released during the operating time of the second timer circuit, that is, the time from the start of the timer circuit until it generates an output signal can also be cleared from the circulating register. Thus, when a plurality of keys are released almost simultaneously, the signals in the register corresponding to these keys can be erased almost simultaneously. Therefore, the minimum time for repeated operation of the same key can be reduced, compared with the case of using an output signal for one bit time as stated above in the first example.

When the keys used are accompanied by a problem of bounce, the bounce may differ somewhat according to the kind of key used and to the operation speed, but bounce occurs almost in a fixed period with an almost fixed dispersion from the commencement of the key operation. Thus, the time from the initiation of the aforementioned first timer circuit until an output signal appears at this second timer circuit can be set for such a time period after which chattering has ceased and bounce may begin. In this way, the signal read-in time can be reduced compared with that in the case of detecting the key input signal after the lapse of time in which possible bounce ends. Of course, if such extremely high speed key input is not needed, the key input may be detected after the lapse of time in which possible bounce ends.

The time of the second timer circuit which is started from the time when the key is released may be set to be shorter than the duration of key chattering at the release of a key. Even if the time of the second timer circuit may be shortened in this way, the adverse effects of key chattering can be prevented as explained below. That is, if the delay time of the second timer circuit is shorter than the chattering time, the first timer circuit may be activated by the key input signal corresponding to a releasing key, however, when the first timer circuit generates an output, the affects of chattering will already have ceased and at this time the key input signal is not detected.

Since the time of the second timer circuit is added to that of the first timer circuit, the effects due to the noise which may remain after a key release can be removed much better by these timer circuits.

According to this invention, a third timer circuit may be adopted for making further improvements. When two or more kinds of keys are operated, when one key input signal is already read-in the circulating register but is lacking for a certain time due to bounce of the key, and if a signal for clearing the contents of the register is supplied from the second timer circuit in response to the release of another key, both of these two signals will be erased from the circulating register. Then, as a result, at the time when the bounce of said one key input signal has ended, this one key input signal will be recognized erroneously as a new input signal by the first gate circuit to generate an output from the first gate circuit. The second timer is not sufficient for removing the inconvenience which may occur when operating more than two kinds of keys simultaneously. Therefore, in the case of using keys which may produce bounce, it is desired to cease the clear operation for a certain time from the commencement of each of the keys, even if there is a signal which may be cleared from the circulating register. The third timer is effective to overcome this bounce.

According to this invention, although it is not to be read in a restrictive sense, the time of the third timer circuit may be added to the time of the first timer circuit for removing the effects of key bounce. Thus, it becomes unnecessary that the third timer circuit should be made to provide all of the times for preventing the above adverse effects of the key bounce. This means a simplification of the structure of the third timer circuit.

Hereinbelow, the embodiments of this invention will be described in conjunction with the drawings.

Figure 2:
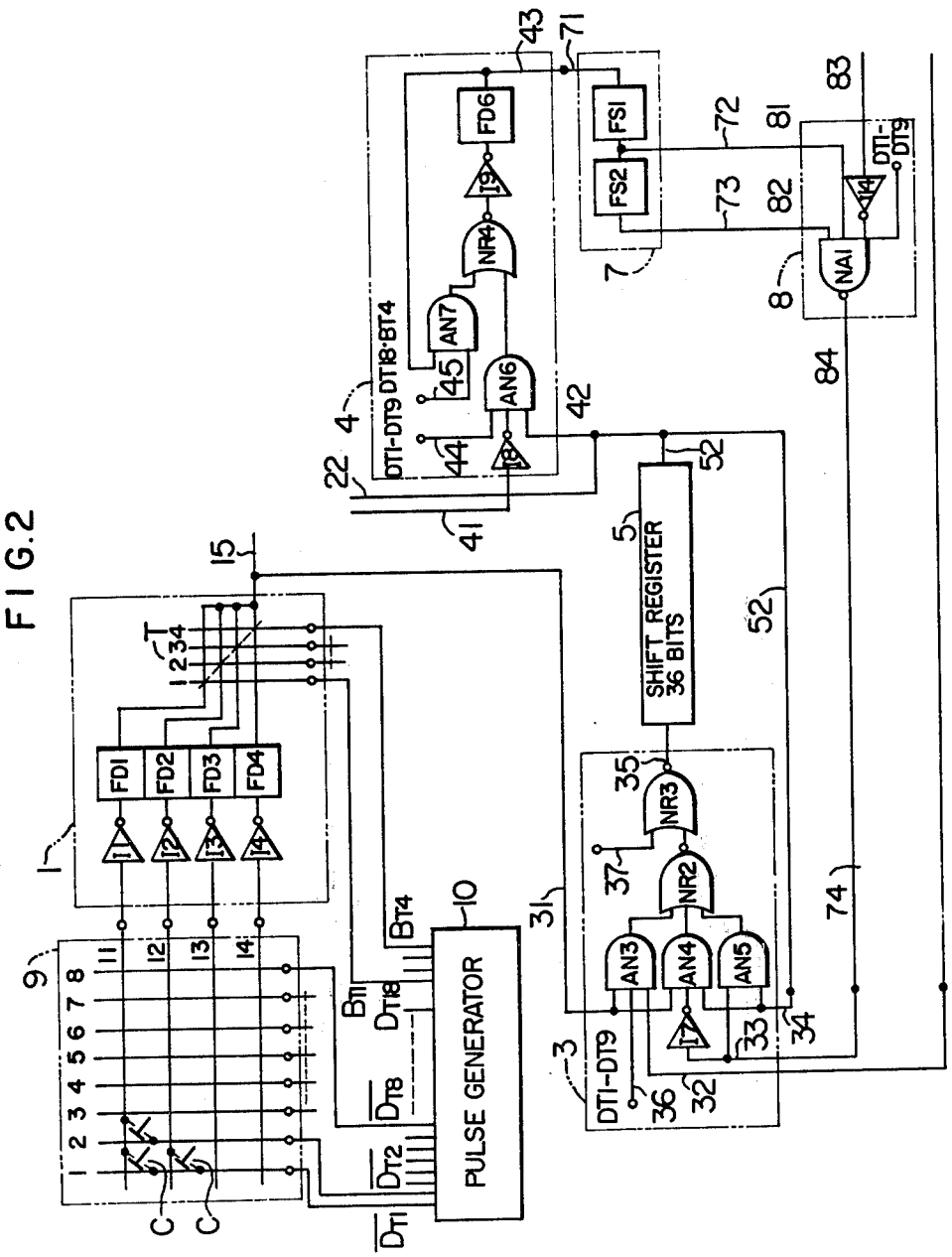
FIGS. 2 to 4 are detailed circuit diagrams of the circuit blocks shown in FIG. 1.
Figures 3, 4:
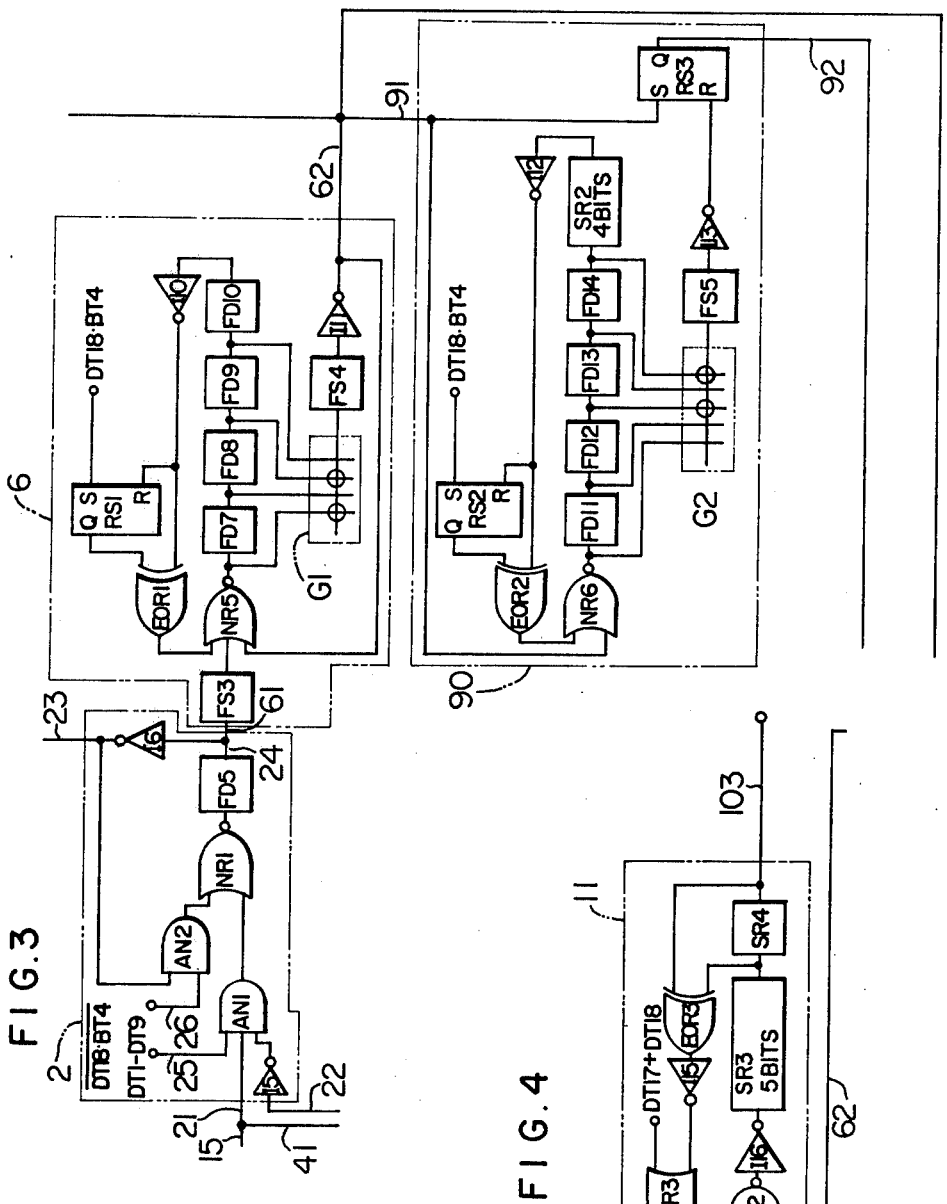

FIG. 1 shows a basic embodiment of the key input circuit according to this invention and the detailed structures of the respective blocks in FIG. 1 are shown in FIGS. 2 to 4.

The key input circuit is used for the key input in an electronic desk-top calculator dealing with the calculation in a binary decimal system. In FIG. 1, some connections for transmitting timing signals are not shown for simplification.

A key scanner 1 receive signals from a keyboard 9 through lines 11 to 14 and supplies a serialized key input signal on an output line 15. In FIG. 2, the keyboard 9 is formed in a matrix including column lines 1 to 8 and row lines 11 to 14. At each cross point of a column line and a row line, a key contact C is formed. Thus, this keyboard 9 has $8 \times 4 = 32$ key contacts. To the respective column lines 1 to 8, digit pulses $D_{T1}$ to $D_{T8}$ among those shown in waveforms H to K in FIG. 5 are applied from a pulse generator circuit 10.

Signals generated on the row lines 11 to 14 of the keyboard 9 are applied to the corresponding input lines 11 to 14 of the key scanner 1. These signals are inverted through corresponding inverters I1 to I4 and applied to flip-flops FD1 to FD4 corresponding to these inverters I1 to I4. These flip-flops FD1 to FD4 remove the inadequate distortion of the digit pulses $D_{T1}$ to $D_{T8}$ which distortion may occur in the transmission from the pulse generator 10 to the keyboard 9 and from the keyboard 9 to the key scanner 1 and provide shaped digit pulses adjusted in time and signal level for the following circuits. These flip-flops FD1 to FD4 are synchronized with a clock pulse CPD shown at waveform G of FIG. 5 and provide an output signal in a digit period next to the digit period DT in which a key input signal is generated on a corresponding input line. Thus, when the key contact C between the column line 1 and the row line 11 is closed in the keyboard 9, for example, the digit pulse $D_{T1}$ is supplied to the flip-flop FD1 and the flip-flop FD1 supplies a shaped output in synchronism with the digit pulse $D_{T2}$.

The outputs of the flip-flops FD1 to FD4 are applied to four input lines of a gate circuit T in the key scanner 1, respectively.

Figure 5:
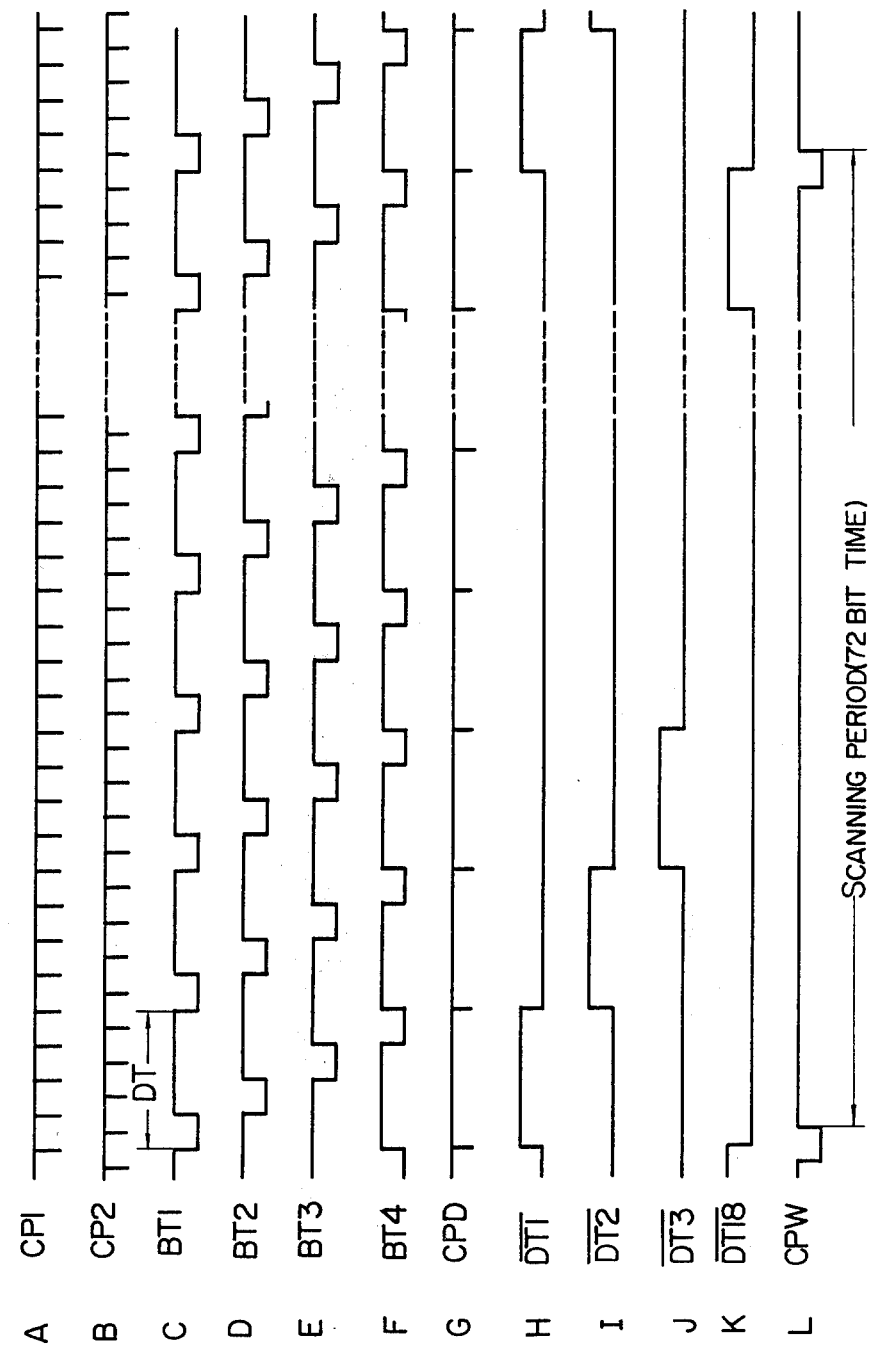

The gate circuit T receives bit signals $B_{T1}$ to $B_{T4}$ shown at waveforms C to F in FIG. 5 from the pulse generator 10 on the other input lines and is arranged to output on the output line 15 the signal from the flip-flop FD1 by means of the bit signal $B_{T1}$. In the same way, the signal from the flip-flop FD2 is outputted by the bit signal $B_{T2}$, the signal from the flip-flop FD3 by the bit signal $B_{T3}$, and the signal from the flip-flop FD4 by the bit signal $B_{T4}$.

Thus, the digit pulses $\overline{D_{T1}}$ to $\overline{D_{T8}}$ appearing on the row line 11 of the keyboard 9 are sampled only by the bit pulse $B_{T1}$, and similarly those pulses on the row lines 12 to 14 are sampled by the bit pulses $B_{T2}$ to $B_{T4}$, respectively. For example, when one key contact is depressed at time $t_1$ and released at time $t_7$ as shown by waveform A of FIG. 6, a signal corresponding to the depressed key contact C appears repeatedly during the period of the key depression $t_1$ to $t_7$ as shown at waveform B of FIG. 6. In each scanning period, a serialized signal occupies one time site among 32 different time sites $D_{T2} \cdot B_{T1}$ to $D_{T9} \cdot B_{T4}$. The depressed key is identified by the occupied time site.

In this embodiment, the maximum number of usable digit pulses is 18, $D_{T1}$ to $D_{T18}$, as shown at the waveforms H to K of FIG. 5. Among these, eight digits $D_{T1}$ to $D_{T8}$ are used for scanning the keys and the key input signals appear on the output line 15 in the digit lines $D_{T2}$ to $D_{T9}$. Therefore, signals appear only in the former half of each one scanning period on the output line 15.

A gate circuit 2 has one input line 21 connected to the output line 15 and receives the serialized key input signal. The other input line 22 of the first gate 2 is connected to the output line 52 of a shift register 5. The gate circuit 2 outputs an output signal corresponding to the key input signal on output lines 23 and 24 when the key input signal appears on the output line 15 of the key scanner 1 and the signal corresponding to the key input signal does not appear on the output line 52 of the shift register 5.

In FIG. 3, the gate circuit 2 includes an AND circuit AN1 having three input lines. The AND circuit AN1 receives the logic sum signal of the digit pulses $D_{T1}$ to $D_{T9}$ on an input line 25, and also receives the signal from the shift register 5 through an inverter I5 on another input line 22. Thus, the AND circuit AN1 outputs, for example during the period in which the digit pulses $D_{T1}$ to $D_{T9}$ arrive, a signal as shown at waveform C of FIG. 6 which signal corresponds to the key input signal from the input line 21 as shown at waveform B of FIG. 6, using the signal from the shift register 5 as shown at waveform E of FIG. 6 as an inhibit signal.

As will be described later, when a key input signal is once inputted in the shift register 5, the shift register 5 outputs the corresponding signal twice in each scanning period, i.e., once in the period of digits $D_{T1}$ to $D_{T9}$ and once in the period of digits $D_{T10}$ to $D_{T18}$.

Since key input signals appear on the output line 15 of the key scanner 1 during the period of $D_{T2}$ to $D_{T9}$ the digit pulses $D_{T1}$ to $D_{T9}$ applied to the input line 25 effects the operation of the AND circuit AN1 only in this period.

In the gate circuit 2, a NOR circuit NR1 has two input lines, one connected to the output line of the AND circuit AN1 and the other connected to the output line of another AND circuit AN2. The output of the NOR circuit NR1 is connected to the input line of a flip-flop circuit FD5. The output line of the flip-flop FD5 is connected to an output line 24 and to the input line of an inverter circuit I6. The output line of the inverter circuit I6 is connected to one input line of the AND circuit AN2 as well as to the output line 23.

The NOR circuit NR1, the flip-flop FD5, the inverter I6 and the AND circuit AN2 form a circulating loop which is controlled by the signal applied to the other input line 26 of the AND circuit AN2. To this input line 26 of the AND circuit AN2, the negative (complement) digit signal $D_{T18} \cdot B_{T4}$ of the logic product of the digit pulse $D_{T18}$ and the bit pulse $B_{T4}$, i.e. the last signal of the key scanning period is applied. The circuit consisting of the NOR circuit NR1, the flip-flop FD5, the inverter I6 and the AND circuit AN2 form an RS flip-flop circuit using the output of the AND circuit AN1 as the set signal and the pulse $D_{T18} \cdot B_{T4}$ as the reset signal. For example, if the AND circuit AN1 supplies an output signal as shown at waveform C of FIG. 6, an output signal as shown at waveform D of FIG. 6 is generated on the output line 24.

The duration of the set state $t_s$ in this RS flip-flop in the first gate 2 corresponds to the individual key contact C, since the time to start the setting by the output signal of the AND circuit AN1 differs according to the position of the depressed key contact C in the keyboard 9.

As will be described later, the difference of the duration of the set state of this RS flip-flop is used for detecting the corresponding key contact C.

In FIG. 1, the output line 24 of the gate circuit 2 is connected to the input line 61 of a timer circuit 6. Thus, the timer circuit 6 is activated by the output of the gate circuit 2 and generates an output for one scanning period on an output line 62 after a predetermined period.

In FIG. 3, the input line 61 of the timer circuit 6 is connected to a flip-flop FS3 which reads in the input signal at the time of the bit pulse $D_{T18} \cdot B_{T4}$. The flip-flop circuit FS3 has an output connected to one of the three input lines of a NOR circuit NR5.

The gate circuit 2 generates the negative output signal of the RS flip-flop circuit consisting of the NOR circuit NR1, the flip-flop FD5, the inverter I6, and the AND circuit AN2 on the output line 24 connected to the timer circuit 6. Thus, in the timer circuit 6, the flip-flop circuit FS3 receives the signal of logic 1 unless a key input signal appears on the output line of the AND circuit AN1 in the gate circuit 2, i.e. unless a key contact C in the keyboard 9 is depressed. The flip-flop FS3 retains the level of logic 0 from the key scanning period next to the key scanning period in which the RS flip-flop in the gate circuit 2 is first set until the key scanning period in which the RS flip-flop is no longer set.

The three input lines of the NOR circuit NR5 are connected to the output line of the flip-flop FS3, that of an exclusive OR circuit EOR1 and that of an inverter I11.

The output line of the NOR circuit NR5 is connected to the input line of a flip-flop circuit FD7. Flip-flops FD7 to FD10 are connected in series and the output of the flip-flop FD10 is connected to the input line of an inverter circuit I10. The output line of the inverter circuit I10 is connected to the reset terminal R of an RS flip-flop circuit RS1 and is also connected to one input line of the exclusive OR circuit EOR1. Further, the output line of the exclusive OR circuit EOR 1 is connected to one input line of the NOR circuit NR5.

The NOR circuit NR5, flip-flops FD7 to FD10, inverter I10 and the exclusive OR circuit EOR1 as mentioned above form a circulating loop for the flip-flops FD7 to FD10.

Here, when the signal levels on two input lines of the NOR circuit NR5 which has three input lines are simultaneously zero, the NOR circuit NR5 generates an output signal negating the signal on the remaining one input line.

Thus, when the output logic level of the flip-flop circuit FS3 is zero, and also that of the inverter circuit I11 is zero, the output signal of the exclusive OR circuit EOR1 is negated and appears on the output of the NOR circuit NR5. The exclusive OR circuit EOR1 transmits the signal on one input line of EOR1 directly to the output line thereof when the signal on the other input line thereof is logic 0, and transmits a signal made by negating the signal on the one input line on the output line, when the signal on the other input line is logic 1.

To one input line of the exclusive OR circuit EOR1 the output line of the RS flip-flop circuit RS1 is connected, and to the set terminal S of the RS flip-flop circuit RS1 the bit pulse $D_{T18} \cdot D_{T4}$ is applied which pulse is the last one in each key scanning period, while to the reset terminal R of the RS flip-flop RS1 the output of the inverter I10 is applied.

When the output level of the flip-flop circuit FS3 is logic 1, the output of the NOR circuit NR5 is logic 0 regardless of the inputs from the exclusive OR circuit EOR1 and the inverter circuit I11 and hence the inputs and the outputs of the flip-flops FD7 to FD10 are all logic 0.

When the output level of the flip-flop FS3 changes to logic 0, the NOR circuit NR5, the flip-flops FD7 to FD10, the inverter I10 and the exclusive OR circuit EOR1 form a circulating loop. In this case, in the key scanning period from $D_{T1} \cdot B_{T1}$ to $D_{T18} \cdot B_{T3}$ the inverter I10 generates an output of logic 1, therefore, the RS flip-flop RS1 is reset to supply an output of logic 0. As a result, the output level 1 of the inverter I10 directly appears on the output of the exclusive OR circuit EOR1. Hence, in the period from $D_{T1} \cdot B_{T1}$ to $D_{T18} \cdot B_{T3}$, the inputs and outputs of the flip-flops FD7 to FD10 are all zero. More particularly, in the period from $D_{T1} \cdot B_{T1}$ to $D_{T18} \cdot B_{T3}$, signal 0 circulates once per four bit times, i.e. one digit time, through the flip-flops FD7 to FD10.

At the bit time of $D_{T18} \cdot B_{T4}$, the RS flip-flop RS1 is set by the signal applied to the set terminal S. Then, the RS flip-flop RS1 generates an output signal of logic 1 in the following bit time $D_{T1} \cdot B_{T1}$ in the next scanning period. At this time, the exclusive OR circuit EOR1 receives a signal of level 1 from I10 and a signal of level 1 from RS1, therefore, the output signal of EOR1 becomes logic 0. Thus, the output of the NOR circuit NR5 becomes logic 1. In $D_{T1} \cdot B_{T2}$, the outputs of the flip-flops FD7 to FD10 becomes 1, 0, 0, 0, respectively by this output signal of logic 1 from the NOR circuit NR5. In the preceding bit time $D_{T1} \cdot B_{T1}$, the reset terminal of the flip-flop RS1 receives the negative output of the flip-flop 10, i.e. a signal of logic 1, and hence the RS flip-flop is reset to generate the output of logic 0 from the bit time $D_{T1} \cdot B_{T2}$. Then, the output of the inverter I10 appear directly on the output of the exclusive OR circuit EOR1.

In this scanning period until the bit time of $D_{T18} \cdot B_{T4}$, the signal 1 circulate through the flip-flops FD7 to FD10 once in one digit period. Thus, at the bit time of $B_{T1}$ in every digit period, the outputs of the flip-flops FD7 to FD10 become 0, 0, 0, 1 (referred to as 0001 hereinbelow). Similarly, in the next scanning period, the output of the flip-flops FD7 to FD10 at the bit time $B_{T1}$ of each digit period becomes 0010. Similarly, if a gate circuit G1 is not provided, the output of the flip-flops FD7 to FD10 at the bit $B_{T1}$ in the following scanning periods becomes 0011, 0100, ... 1111, and 0000. This signal is treated as a binary number. Namely, the outputs of the flip-flops FD7 to FD10 have weights of 8, 4, 2, 1, respectively.

The gate circuit G1 is composed of a NAND gate circuit having four input lines. Among the four input lines, those marked with a circle ○ are made to represent intrinsic input lines and those not marked with ○ are made to represent dummy input lines. To the output line of the gate circuit G1 the input line of a flip-flop FS4 is connected. The flip-flop FS4 reads in the input signal in synchronism with the bit $D_{T18} \cdot B_{T4}$, therefore, in the circuit of FIG. 3, the flip-flop FS4 is set when the input lines receive the signals of weight 8 and 2 simultaneously.

The flip-flop FS4 is set after the lapse of ten scanning periods from the activation of the flip-flop FS3. When the flip-flop FS4 is set, the output of the inverter I11 which receive the output of the flip-flop FS4 becomes 1. When the NOR circuit NR5 receives this output 1 of the inverter I11, it generates an output of logic 0 regardless of the signal from the exclusive OR circuit EOR1. For example, when the signal shown at waveform D of FIG. 6 is applied to the input line 61, an output appears on the output line 62 for one scanning period from time $t_3$ to time $t_6$ as shown at waveform F of FIG. 6.

In FIG. 1 an input line 33 of a gate circuit 3 is connected to the output line 84 of a gate circuit 8. Another input line 34 is connected to the output line 52 of the shift register 5.

As shown in FIG. 2, the gate circuit 3 consists of an inverter 17, AND circuits AN3 to AN5, and NOR circuits NR2 and NR3. This gate circuit 3 transmits a key input signal to the output line 35 when it receives the output signal of the timer circuit 6 on one input line 32 of the AND gate AN3. To an input line 36 of the AND circuit AN3, the logic sum of the digit pulses $D_{T1}$ to $D_{T9}$ is applied so as to prevent undesirable signals from being transmitting from the input line 31 to the output line 35.

The AND circuit AN4 has three input lines; one connected to the input line 31, one of the others to the output line 84 of a gate circuit 8 through the inverter 17, and the remaining one to the input line 34 which is connected to the output line 52 of the shift register 5.

The output signal of the gate circuit 8 on the line 84 is used for removing the contents stored in the shift register 5 as will be described later, and the signal level for this removal is of logic 0. When there is no output signal from the gate circuit 8, the signal level on the output line 84 is of logic 1. In this case, as a result, AND circuit AN5 is opened and the contents of the shift register 5 circulates through the AND circuit AN5.

When an output signal appears at the gate circuit 8, the AND circuit AN5 is closed and the circulation of the contents of the shift register through the AND circuit AN5 is cut off. At the same time, the signal level on the output line of the inverter circuit 17 becomes of logic 1, and hence those output signals of the shift register 5 which coincide with the key input signal is inputted into the shift register 5 through the AND circuit AN4.

As a result, when an output signal appears at the gate circuit 8, only those signals which correspond to the key input signals which have disappeared from the output line 15 of the key scanner 1 are removed from the shift register 5. This structure of re-circulating the signal coresponding to the key input signal on the output line 15 in the erasing operation of the shift register 5 is effective for the case when another key input signal which has already been applied to the key encoder 11 still exists on the output line 15. By the fact that the signal corresponding to said other key input signal is not removed from the shift register 5 in the erasing cycle it is prevented from outputting the other key input signal from the gate circuit 2.

An input line 37 of the NOR circuit NR3 is used for erasing by force all the content of the shift register 5 regardless of the existence or absence of the corresponding key input signals. In normal operation of the key input, the signal level on this input line 37 is set at logic 0 but in the operation of the above enforced erasing the signal level is set to be of logic 1.

The shift register 5 in FIG. 1 has an input line 51 and an output line 52. This shift register 5 is made to have an ability of storing and circulating a number of pieces of informations at least equal to or more than the number of the key contacts. In this embodiment, the shift register 5 has 36 bit stages while the number of the key contacts is 32.

As described before, the key scanning period includes 18 digit periods, i.e. $18 \times 4 = 72$ bit times in this embodiment. In the shift register 5, the number of bit stages is increased by 4 bits compared to the number of bits required by the key contacts. As a result, one circulation period of the shift register 5 is made to be one half of the scanning period. Thus, the signals stored in the shift register 5 circulate precisely twice in one key scanning period. For example, when the time circuit 6 generates an output for one scanning period from $t_3$ to $t_6$ as shown at waveform F of FIG. 6, the key input signal appearing at time $t_4$ between times $t_3$ and $t_6$ on the output line 15 is applied to the shift register 5. Therefore, the shift register 5 generates such output signal as shown at waveform E of FIG. 6 from time $t_5$, that is, the time after the lapse of 36 bit times from $t_4$. This state continues to time $t_{12}$ which is just before time $t_{13}$ when the output of the timer circuit 90 disappears as shown at waveform H of FIG. 6. This structure of the shift register 5 shows that a reduction of the number of elements for the shift register can be made even when the key scanning period is long. Further, revising to set the duration of signal generation to be an integer times long as the scanning period, shows that the shift register 5 can be controlled by clock pulses subjected to no particular treatment.

As is shown in FIG. 1, the output line 52 of the shift register 5 is connected to an input line 42 of a gate circuit 4. The other input line 41 of the gate circuit is connected to the output line 15.

The gate circuit 4 generates an output signal which corresponds to the output signal of the shift register 5 when no signal corresponding to the output signal at the shift register circuit 5 appears on the output line 15, that is, when a key contact is opened.

FIG. 2 shows a detailed structure of the gate circuit 4. This gate circuit 4 operates in a manner similar to that of the gate circuit 2 shown in FIG. 3. That is, with the use of an inverter circuit I8 and an AND circuit AN6, the output signal of the shift register 5 is transmitted to the output of the AND circuit AN6 making the key input signal on the line 15 as an inhibit signal. An input line 44 of the AND circuit AN6 is applied with the logic sum signal of the digit pulses $D_{T1}$ to $D_{T9}$, and the AND circuit AN6 compares the two other input signals on the input lines 41 and 42 only in this input period. The signals $D_{T1}$ to $D_{T9}$ on the input line 44 prevent the inhibition of the output signal from the shift register 5 by any signal on the line 41 during the time period in which there is substantially no key input signal on the line 15, i.e. in the time from $D_{T10}$ until $D_{T18}$.

The output signal of this AND circuit 6 sets the RS flip-flop consisting of a NOR circuit NR4, an inverter circuit I9, a flip-flop inputting and outputting signal in synchronism with clock pulses CP2 and CP1, and an AND circuit AN7. This RS flip-flop circuit is reset by the signal applied on an input line 45 of the AND circuit AN7, i.e. the last bit pulse $D_{T18} \cdot B_{T4}$ of each key scanning period.

For example, when a key contact is opened at time $t_7$ as shown at waveform A of FIG. 6, the gate circuit 4 generates an output from time $t_8$ to time $t_{12}$ when the corresponding signal in the shift register 5 disappears as shown at waveform G of FIG. 6, since the gate circuit 4 is comparing the key input signal as shown at waveform B of FIG. 6 with the output signal from the shift register 5 as shown at waveform E of FIG. 6. The output line 43 of the gate 4 is connected to the input line 71 of the second timer circuit 7.

The timer circuit 7 includes flip-flop circuits FS1 and FS2 which accept the input signal at the last bit time $D_{T18} \cdot B_{T4}$ of each scanning period. Thus, the flip-flop FS1 generates an output signal on the output line 72 from the scanning period following next to that in which an output signal appears for the first time on the output line 43, and retains the same output state until the scanning period following next to that in which the signal on the output line 43 disappears. Similarly, the flip-flop FS2 generates an output on the output line 73 from the further next scanning period on. As a result, for example, on the output lines 72 and an output level 1 appears simultaneously from time $t_{10}$ which is two scanning periods after time 9 when an output appears on the output line 43 of the second gate circuit 4, as shown at waveform H of FIG. 6.

The gate circuit 8 includes a NAND circuit NA1 and an inverter circuit 114. One input line of the NAND circuit NA1 is connected to the output line of the inverter I14 and another input line is connected to the source (not shown) of the logic sum of the digit pulses $D_{T1}$ to $D_{T9}$. The other input lines 81 and 82 are connected to the output lines 72 and 73 of the third timer circuit 7. Thus, during the time of digit pulses DT1 to DT9, the circuit 8 generates an output signal of logic 0 on the output line 84 when the inverter I14 provides an output of logic 1 and simultaneously the signal levels on the lines 72 and 73 are both of logic 1. This output signal of the circuit 8 is used to clear the contents of the shift register 5. Thus, after three scanning periods from the disappearence of the key input signal, the contents of the shift register 5 are cleared by means of the gate circuit 4, timer circuit 7 and gate circuit 8.

To the inverter circuit I14 of the gate circuit 8, the output signal of a timer circuit 90 is applied. As shown in FIG. 3, in the timer circuit 90 the input line 91 is connected to the output line 62 of the timer circuit 6. The timer circuit 90 includes a NOR circuit NR6, flip-flops FD11 to FD14 and FS5, a 4-bit shift register SR2, inverter circuits $I_{12}$ and $I_{13}$, a gate G2, RS flip-flops RS2 and RS3 and an exclusive OR circuit EOR 2. The RS flip-flop RS3 is set by the signal on the input line 91 and is reset by the output line of the inverter circuit $I_{13}$. The output line of the RS flip-flop RS3, that is, the output line 92 of the timer circuit 90 supplies an inhibition input signal for the gate circuit 8. The output signal on the line 92 is kept from time $t_6$ when an output signal appears from the timer circuit 6 until time $t_{11}$ when an output signal appears from the inverter $I_{13}$, as shown at waveform I of FIG. 6.

The NOR circuit NR6, the flip-flops FD11 to FD14, the 4-bit shift register SR2, the inverter I12, the RS flip-flop RS2 and the exclusive OR circuit EOR 2 form a counter circuit. The RS flip-flop RS2 is set by the last bit pulse $D_{T18} \cdot B_{T14}$ in one scan period RS1 and is reset by the output signal of the inverter I12, as in the case of setting or resetting RS1 shown in the same figure. Therefore, the counter circuit changes the contents of the flip-flops FD11 to FD14 and the 4-bit shift register SR2 by one unit of the binary number during one scanning period. More particularly, signal level of logic 0 is inputted in force to the flip-flops FD11 to FD14 and the shift register SR2 by the signal during one scanning period applied on the input line 91 from the timer circuit 6. In the next scanning period, the signal inputted in force on the input line 91 vanishes, therefore, the counter consisting of NR6, FD11 to FD14, SR2, I12, RS2 and EOR2 begins to count from the initial state, i.e., 00000000.

The respective input lines of the flip-flops FD11 to FD14 and the shift register SR2 are also connected to the input lines of the gate circuit G2. The gate circuit G2 is composed of a NAND gate circuit and the input lines corresponding to the input lines of the flip-flop FD13 and the shift register SR2 are made to be the intrinsic input lines. The signals on the input lines corresponding to the flip-flop FD13 and the shift register SR2 have weights of 32 and 8 respectively. Thus, the input condition of the gate circuit G2 at the bit time $D_{T18} \cdot B_{T4}$ can be first satisfied when 40 scanning periods have passed from the initial state. Since the output line of the gate circuit G2 is connected to the input line of the flip-flop FS5 which accepts the input signal at the bit $D_{T18} \cdot B_{T4}$, the flip-flop FS5 is set only for one scanning period after the above 40 scanning periods. As a result, the inverter I13 provides an output of logic 1 only during this set period on its output line.

The timer circuit 90 is used for preventing the error operation of the circuit due to the bounce of the key contact after the read-in of the key input signal. The time duration for this prevention is selected in accordance with the assigning of which lines are to be the intrinsic input lines of the gate circuit 2.

In FIG. 1, a key encoder 11 receives the key input signal on one input line 101 through the output line 23 of the gate circuit 2 and the read enable signal on the other input line 102 through the output line 62 of the timer circuit 6. When the timer circuit 6 generates an output signal on the output line 62 in one scanning period, the key encoder 11 is allowed to read the key input signal by this signal of the scanning period.

As shown in FIG. 4, the key encoder 11 includes a NAND circuit NA2, an inverter I16, a 5-bit shift register SR3, a 1-bit shift register SR4, an exclusive OR circuit EOR3, an inverter circuit 115 and an OR circuit OR3. The inputs and outputs of the shift registers SR3 and SR4 are controlled by the clock pulses CP2 and CP1. The NAND circuit Na2 and the OR circuit OR3 constitute a counter circuit, the count of which is controlled by signals on the input lines 101 and 102 of the NAND circuit NA2. When both of the output signal from the gate circuit 2 and that from the first timer circuit 6 are logic 1, the NAND circuit NA2 negates the output of the OR circuit OR3 and outputs the negative signal on the output line, thus, a circuit loop for counting is formed. Since the output signal of the timer circuit 6 continues for one scanning period and the output of the first gate circuit 2 continues from the time corresponding to the depressed key contact to the last time of one scanning period in each scanning period, the counting time of the above counter circuit differs according to the kinds of respective key contacts.

In this embodiment, the output signal of the key encoder 11 is read out from the output line 103 in eight bit time of the digits $DT_{17}$ and $DT_{18}$. In the read-out period, in the first 6 bit time the signal on the output line 103 reflects or represents the contents of the shift registers SR4 and SR3 which contents are counted ones, and during the remaining two bit time a signal of logic 1 is outputted which signal corresponds to the logic sum signal of the digit pulses $D_{T17}$ and $D_{T18}$ inputted to the input line of the OR circuit OR3. By the addition of bits which have no direct relation to the above mentioned counter operation using digit pulses, the output of the key encoder 11 can be treated in the construction of a multiple of 4 bits, i.e. 8 bits, and the control of the following circuits becomes easy.

In this way, the key input signal requiring the region of 32 bits is transformed to an 8-bit signal and this reduced 8 bit key signal enables to reduce also the number of elements required for the following circuits. Namely, the output signal of the key encoder 11 is once stored in a flip-flop circuit of 8 bits and the output of this 8-bit flip-flop circuit is applied to a matrix circuit (not shown).

Although there is no restrictive meaning, the respective circuits shown in FIGS. 2 and 3 may be formed of various kinds of circuits using a depletion mode type IGFET (insulated gate field effect transistor) as a load as shown in FIGS. 7A to 7L'. Namely, inverters I1 to I16 may be formed of the circuit of FIG. 7A', flip-flops FD1 to FD4 of the circuit of FIG. 7I' with a terminal 104 applied with CPD, flip-flops FD5 to FD14 of the circuit of FIG. 7I' with the terminal 104 applied with CP1, each bit stage of the shift registers SR1 to SR4 of the circuit of FIG. 7H', flip-flops FS1 to FS5 of the circuit of FIG. 7j', RS flip-flops RS1 and RS2 of the circuit of FIG. 7K', and RS flip-flop RS3 of the circuit of FIG. 7L'. Further, the coupled circuit of the AND circuits AN1 and AN2 and the NOR circuit NR1 and another coupled circuit of the AND circuits AN6 and AN7 and the NOR circuit NR4 may be formed of such a special circuit as shown in FIG. 7E'.

In this embodiment, the time of the timer circuits can be easily varied by the selection of the intrinsic input lines of the gate circuits G1 and G2.

Further, the above embodiment is suited for an integrating circuit by means of IGFET. For example, in the gate circuit as shown in FIG. 7G, according to the integrating circuit technology, the input lines a, b and c are connected to IGFETs each corresponding to each of the input lines respectively, that is, to the gate electrodes of three IGFETs. Among these, the IGFETs connected with input lines a and c are of enhancement type and the IGFET connected with the input line b of depletion type. According to this structure, the source-to-drain channel of the IGFET connected with the input line b is always conductive and can be neglected from the point of logic operation of the circuit. Thus, the circuit can be represented as shown in FIG. 7G'. The gate circuit shown in FIG. 7G' can be easily changed without changing the dimension of the integrated circuit and also without changing other circuits.

In the foregoing, description has been made on the embodiment, but this invention is not limited to the structure of the above embodiment.

For example, the digit pulses applied to the key matrix were made negative pulses, since they are also used to dynamically drive display means such as digitrons, in the above embodiment. If there is no such requirement, the inverters I1 to I4 in the key scanner 1 in FIG. 2 are unnecessary. Further, when there are distortions of the order which may cause problems in the signals from the keyboard, the flip-flops FD1 to FD4 may be dispensed with.

Figure 8:
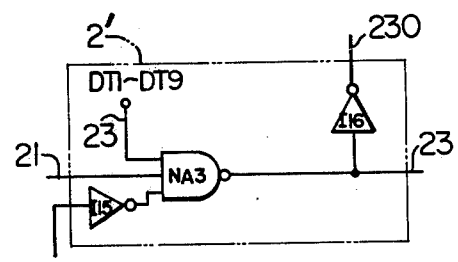
FIGS. 8 and 9 are partial circuit diagrams of other embodiments.

Further, when there is no need of transforming the key input signal into a binary number for the key encoder, the gate circuit 2 in FIG. 3 may be constructed as shown in FIG. 8.

Figure 9:
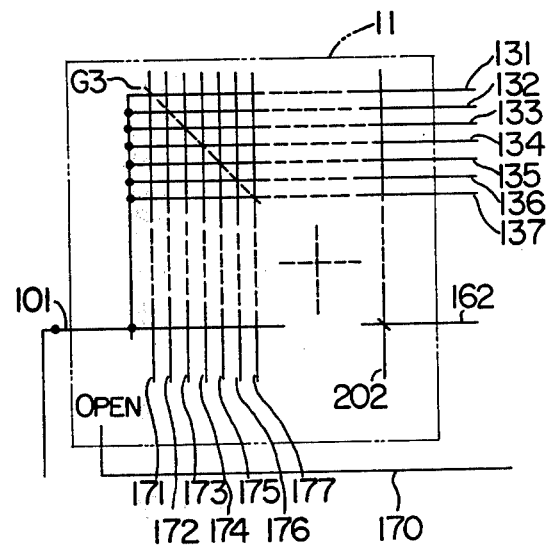

Also, the key encoder circuit 11 of FIG. 4 may be replaced by a gate circuit G3 as shown in FIG. 9 in which the signals of $D_{T2} \cdot B_{T1}$ to $D_{T9} \cdot B_{T4}$ are applied to the input lines 171 to 202, respectively, and the output line 103 is replaced by lines 131 to 162.

What is claimed is:

1. A key input circuit comprising:
    input means for generating serialized key input signal corresponding to operated keys;
    a circulating register with a predetermined delay time for circulating its content and giving a predetermined delay time to input signals for appearing at its output;
    a first gate circuit for receiving the serialized key input signal from said input means and the output signal of said circulating register and generating an output corresponding to said key input signal using the output signal of said circulating register as an inhibitation signal;
    a first timer circuit having an input line connected to said first gate circuit and an output line for supplying an output signal, activated by the output signal of said first gate circuit and generating an output after a predetermined time from the activation; and
    a second gate circuit having first and second input terminals and an output terminal respectively connected with the output terminal of said first timer circuit, the output terminal of said input means and the input terminal of said circulating register for allowing the input of said key input signal into said circulating register after a predetermined time from said activation of the first timer circuit with the use of the output of said first timer circuit, wherein the output of said circulating register is synchronized with said key input signal.

2. A key input circuit according to claim 1, further comprising:
    output means connected to said first gate circuit and said first timer circuit for receiving the output signal of said first gate circuit under the control of the output signal of said first timer circuit.

3. A key input circuit according to claim 1, further comprising:
    a third gate circuit connected to said input means and said circulating register for generating an output corresponding to the output signal of said circulating register with the use of said key input signal as an inhibitation signal; and
    a second timer circuit connected to said third gate circuit, said second timer circuit being activated by the output signal of said third gate circuit and generating an output signal after a predetermined time;
    said second gate circuit being connected to said second timer circuit and opening the circulation of said circulating register under the control of the output of said second timer circuit.

4. A key input circuit according to claim 3, further comprising:
    a third timer circuit activated by the output of said first gate circuit and supplying an output to said second gate circuit for preventing the opening of the circulation of said circulating register by the output of said second timer circuit.

5. A key input circuit according to claim 4, wherein said third timer circuit is connected to said first timer circuit and is activated by the output of said first timer circuit.

6. A key input circuit according to claim 1, wherein said input means comprises means for generating a serialized key input signal corresponding to the depressed key in synchronism with a bit pulse generated during a predetermined bit time within one predetermined key scanning period.

7. A key input circuit according to claim 6, wherein said serialized key input signal has a logic level generated during said predetermined bit time within the time of 1/n of said predetermined key scanning period wherein n is an integer, and the delay time of said circulating register is made 1/n of said predetermined key scanning period.

8. A key input circuit according to claim 1, wherein said first timer circuit includes flip-flops and gate means for receiving the output of said flip-flops to determine the time of said first timer, said gate means including an intrinsic input line whose state is dependent on the state of the output signal of said flip-flops and a dummy input line whose state is independent of the state of the output signal of said flip-flops.

9. A key input circuit according to claim 1, wherein said first gate circuit has an inhibit input for making the input to said first gate valid only during the time in which the serialized key input signal is received.

10. A key input circuit according to claim 6, wherein said first timer circuit comprises means for generating an output signal so as to open said second gate for inputting the serialized key input signal to said circulating register only for said predetermined key-scanning period after a fixed time after said first timer is started by the output of said first gate circuit.

11. A key input circuit according to claim 7, wherein said first timer circuit comprises means for generating an output signal to effect application of the serialized key input signal to said circulating register only for said predetermined bit time, after an integral number of said predetermined key scanning periods has elapsed from the time when said first timer circuit is started by the output of said first gate.

12. A key input circuit according to claim 6, wherein said first gate circuit comprises a flip-flop which is set by a signal representing a logical AND of the serialized key input signal and the inverse of the output of said circulating register, and is reset by a signal generated with the same period as said predetermined key scanning period.

13. A key input circuit according to claim 1, wherein the time of said first timer is set such that the time is longer than the key chattering time and is shorter than the time in which the key starts to bounce.

14. A key input circuit according to claim 1, wherein said first timer is of the bit counter type and an output means is connected to said first timer.

15. A key input circuit according to claim 2, wherein said output means includes a counter for encoding said serialized key input signal into a coded information signal, wherein said counter starts to count in response to a signal representing a logical AND of the output of said first gate circuit and the output of said first timer, and stops its count in response to a timing signal for determining the end of the operation of said counter.

16. A key input circuit according to claim 3, wherein the time of said second timer circuit is longer than that of said first timer circuit.

17. A key input circuit comprising:

input means for generating a key input signal corresponding to an operated key in a first repeated timing period;

a delay circuit for providing a predetermined delay time to input signals at its input for appearing at its output;

a first gate circuit for receiving the key input signal from said input means and the output signal of said delay circuit and generating an output signal corresponding to said key input signal using the output signal of said delay circuit as an inhibitation signal;

a first timing circuit having an input line connected to said first gate circuit and an output line for supplying an output signal, activated by the output signal of said first gate circuit and generating an output signal after a predetermined time from the activation; and a second gate circuit connected between the output terminal of said input means and the input terminal of said delay circuit, to receive the output signal of said first timing circuit as a control signal, said second gate circuit operable so as to allow the input of said key input signal into said delay circuit with the receipt of the output signal from said first timing circuit.

* * * * *